United States Patent
Barnes et al.

(10) Patent No.: US 9,165,587 B2
(45) Date of Patent: Oct. 20, 2015

(54) SYSTEM AND METHOD FOR DUAL-SIDED SPUTTER ETCH OF SUBSTRATES

(75) Inventors: Michael S. Barnes, San Ramon, CA (US); Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 230 days.

(21) Appl. No.: 12/329,457

(22) Filed: Dec. 5, 2008

(65) Prior Publication Data

US 2009/0145752 A1    Jun. 11, 2009

Related U.S. Application Data

(60) Provisional application No. 61/052,131, filed on May 9, 2008, provisional application No. 60/992,972, filed on Dec. 6, 2007.

(51) Int. Cl.
| | |
|---|---|
| *C23F 1/00* | (2006.01) |
| *H01L 21/306* | (2006.01) |
| *C23C 14/00* | (2006.01) |
| *C25B 11/00* | (2006.01) |
| *C25B 13/00* | (2006.01) |
| *G11B 5/84* | (2006.01) |
| *G11B 5/855* | (2006.01) |
| *H01J 37/34* | (2006.01) |

(52) U.S. Cl.
CPC *G11B 5/84* (2013.01); *G11B 5/855* (2013.01); *H01J 37/3438* (2013.01)

(58) Field of Classification Search
CPC .................................................. H01J 37/3438
USPC .............................. 204/298.35; 118/719, 715; 156/345.1–345.45
See application file for complete search history.

(56) References Cited

U.S. PATENT DOCUMENTS

| | | |
|---|---|---|
| 3,968,018 A | 7/1976 | Lane et al. |
| 4,132,624 A | 1/1979 | King et al. |
| 4,261,808 A | 4/1981 | Walter |

(Continued)

FOREIGN PATENT DOCUMENTS

| | | |
|---|---|---|
| CN | 101884069 A | 11/2010 |
| CN | 101889101 A | 11/2010 |

(Continued)

OTHER PUBLICATIONS

International Search Report for PCT Application No. PCT/US08/85728 dated Feb. 19, 2009.

(Continued)

*Primary Examiner* — Keith Hendricks
*Assistant Examiner* — Timon Wanga
(74) *Attorney, Agent, or Firm* — Nixon Peabody LLP; Joseph Bach, Esq.

(57) ABSTRACT

A system is provided for etching patterned media disks. A movable electrode is utilized to perform sputter etch. The electrode moves to near or at slight contact to the substrate so as to couple RF energy to the disk. The material to be etched may be metal, e.g., Co/Pt/Cr or similar metals. The substrate is held vertically in a carrier and both sides are etched serially. That is, one side is etched in one chamber and then in the next chamber the second side is etched. An isolation valve is disposed between the two chambers and the disk carrier moves the disks between the chambers. The carrier may be a linear drive carrier, using, e.g., magnetized wheels and linear motors.

20 Claims, 6 Drawing Sheets

(56) References Cited

U.S. PATENT DOCUMENTS

| | | | |
|---|---|---|---|
| 4,351,714 A * | 9/1982 | Kuriyama | 204/298.26 |
| 4,482,419 A | 11/1984 | Tsukada et al. | |
| 4,575,408 A * | 3/1986 | Bok | 250/492.3 |
| 4,818,326 A | 4/1989 | Liu et al. | |
| 5,213,658 A * | 5/1993 | Ishida | 216/67 |
| 5,244,554 A | 9/1993 | Yamagata et al. | |
| 5,286,296 A | 2/1994 | Sato et al. | |
| 5,296,091 A | 3/1994 | Bartha et al. | |
| 5,425,611 A | 6/1995 | Hughes et al. | |
| 5,651,867 A | 7/1997 | Kokaku et al. | |
| 5,738,767 A * | 4/1998 | Coad et al. | 204/192.12 |
| 5,772,905 A | 6/1998 | Chou | |
| 5,779,803 A * | 7/1998 | Kurono et al. | 118/723 R |
| 5,846,328 A * | 12/1998 | Aruga et al. | 118/718 |
| 5,888,594 A * | 3/1999 | David et al. | 427/577 |
| 5,998,730 A | 12/1999 | Shiozaki et al. | |
| 6,027,618 A | 2/2000 | Aruga et al. | |
| 6,101,972 A | 8/2000 | Bluck et al. | |
| 6,136,160 A | 10/2000 | Hrkut et al. | |
| 6,183,564 B1 * | 2/2001 | Reynolds et al. | 118/719 |
| 6,251,232 B1 * | 6/2001 | Aruga et al. | 204/192.32 |
| 6,268,582 B1 | 7/2001 | Akita et al. | |
| 6,334,960 B1 | 1/2002 | Willson et al. | |
| 6,417,626 B1 * | 7/2002 | Brcka et al. | 315/111.51 |
| 6,440,520 B1 | 8/2002 | Baglin et al. | |
| 6,460,369 B2 * | 10/2002 | Hosokawa | 62/378 |
| 6,482,742 B1 | 11/2002 | Chou | |
| 6,571,729 B2 * | 6/2003 | Sasaki et al. | 118/723 R |
| 6,635,115 B1 * | 10/2003 | Fairbairn et al. | 118/719 |
| 6,669,811 B2 | 12/2003 | Hao et al. | |
| 6,699,332 B1 | 3/2004 | Piramanayagam et al. | |
| 6,762,766 B1 | 7/2004 | Nakayama | |
| 6,770,896 B2 | 8/2004 | Schriever | |
| 6,872,467 B2 | 3/2005 | Qian et al. | |
| 6,919,001 B2 | 7/2005 | Fairbairn et al. | |
| 7,026,098 B2 | 4/2006 | Komatsu et al. | |
| 7,027,156 B2 | 4/2006 | Watts et al. | |
| 7,041,394 B2 | 5/2006 | Weller et al. | |
| 7,147,790 B2 | 12/2006 | Wachenschwanz et al. | |
| 7,314,833 B2 | 1/2008 | Kamata et al. | |
| 7,972,470 B2 * | 7/2011 | Furuta et al. | 118/723 R |
| 8,349,196 B2 | 1/2013 | Fairbairn et al. | |
| 8,784,622 B2 | 7/2014 | Barnes et al. | |
| 2002/0086240 A1 | 7/2002 | Petersson et al. | |
| 2002/0127623 A1 | 9/2002 | Minshull et al. | |
| 2003/0136664 A1 * | 7/2003 | Huff et al. | 204/192.32 |
| 2003/0176074 A1 | 9/2003 | Paterson et al. | |
| 2004/0060518 A1 | 4/2004 | Nakamura et al. | |
| 2004/0096581 A1 * | 5/2004 | Yashiro et al. | 427/248.1 |
| 2004/0129569 A1 * | 7/2004 | Nabeya et al. | 205/93 |
| 2004/0175510 A1 | 9/2004 | Hattori et al. | |
| 2005/0170215 A1 | 8/2005 | Liu et al. | |
| 2005/0183508 A1 * | 8/2005 | Sato | 73/715 |
| 2005/0224344 A1 | 10/2005 | Iwasaki et al. | |
| 2005/0249980 A1 | 11/2005 | Itoh et al. | |
| 2005/0271819 A1 | 12/2005 | Wago et al. | |
| 2006/0102078 A1 | 5/2006 | Fairbairn et al. | |
| 2006/0142890 A1 | 6/2006 | Edo | |
| 2006/0157201 A1 | 7/2006 | Hoffman et al. | |
| 2006/0175197 A1 * | 8/2006 | Chistyakov | 204/298.2 |
| 2006/0236932 A1 | 10/2006 | Yokogawa et al. | |
| 2006/0269796 A1 | 11/2006 | Hyodo | |
| 2007/0012660 A1 | 1/2007 | Lewington et al. | |
| 2007/0209590 A1 | 9/2007 | Li | |
| 2007/0230055 A1 | 10/2007 | Shirotori et al. | |
| 2007/0240982 A1 * | 10/2007 | Tamagaki et al. | 204/298.41 |
| 2007/0275569 A1 | 11/2007 | Moghadam et al. | |
| 2008/0053818 A1 * | 3/2008 | Ui | 204/164 |
| 2008/0062547 A1 | 3/2008 | Bandic et al. | |
| 2008/0075979 A1 | 3/2008 | Inamura et al. | |
| 2008/0083615 A1 * | 4/2008 | Vukovic et al. | 204/298.01 |
| 2008/0085362 A1 | 4/2008 | Yen et al. | |
| 2008/0105542 A1 | 5/2008 | Purdy et al. | |
| 2009/0145879 A1 | 6/2009 | Fairbairn et al. | |
| 2009/0145881 A1 | 6/2009 | Barnes et al. | |
| 2010/0059476 A1 | 3/2010 | Yamamoto et al. | |
| 2012/0090992 A1 | 4/2012 | Fairbairn et al. | |
| 2013/0098761 A1 | 4/2013 | Fairbairn et al. | |

FOREIGN PATENT DOCUMENTS

| | | |
|---|---|---|
| CN | 101889325 A | 11/2010 |
| CN | 103093766 A | 5/2013 |
| EP | 0811704 B1 | 12/1997 |
| EP | 1727134 A1 | 11/2006 |
| JP | 01-173710 A | 7/1989 |
| JP | 02-185967 A | 7/1990 |
| JP | 04-080353 A | 3/1992 |
| JP | H04-250621 A | 9/1992 |
| JP | H05-250665 A | 9/1993 |
| JP | 08-274142 A | 10/1996 |
| JP | 09-190899 A | 7/1997 |
| JP | 2699045 B2 | 1/1998 |
| JP | H10-154705 A | 6/1998 |
| JP | 11-016893 A | 1/1999 |
| JP | 11-219520 A | 8/1999 |
| JP | 2000-239848 A | 9/2000 |
| JP | 2000-260758 A | 9/2000 |
| JP | 2001-107229 A | 4/2001 |
| JP | 2002-027360 A | 1/2002 |
| JP | 2003-124197 A | 4/2003 |
| JP | 2004-178794 A | 6/2004 |
| JP | 2004-326831 A | 11/2004 |
| JP | 2005-108335 A | 4/2005 |
| JP | 2006-509365 A | 3/2006 |
| JP | 2006-268934 A | 10/2006 |
| JP | 2006-303309 A | 11/2006 |
| JP | 2006-331578 A | 12/2006 |
| JP | 2007-012119 A | 1/2007 |
| JP | 2007-066475 A | 3/2007 |
| JP | 2007-173848 A | 7/2007 |
| JP | 2007-220203 A | 8/2007 |
| JP | 2007-272948 A | 10/2007 |
| JP | 2009-102705 A | 5/2009 |
| JP | 2011-507131 A | 3/2011 |
| JP | 2011-507133 A | 3/2011 |
| JP | 2011-507134 A | 3/2011 |
| JP | 2013-225370 A | 10/2013 |
| JP | 5429185 B2 | 12/2013 |
| JP | 5464753 B2 | 1/2014 |
| KR | 1998-042483 A | 8/1998 |
| KR | 10-2004-0018988 A | 3/2004 |
| KR | 10-2006-0089265 A | 8/2006 |
| KR | 10-2010-0096128 A | 9/2010 |
| KR | 10-2010-0099147 A | 9/2010 |
| KR | 10-2010-0103493 A | 9/2010 |
| TW | 422890 B | 2/2001 |
| TW | 559944 B | 11/2003 |
| TW | 2004/16856 | 9/2004 |
| TW | 1230742 B | 4/2005 |
| TW | 2006-00609 A | 1/2006 |
| TW | 1252259 B | 4/2006 |
| TW | 200930826 A | 7/2009 |
| TW | 200937389 A | 9/2009 |
| TW | 1401331 B1 | 7/2013 |
| TW | I421360 B | 1/2014 |
| WO | 03/081633 A2 | 10/2003 |
| WO | WO 03/081633 A2 | 10/2003 |
| WO | 2004/044595 A2 | 5/2004 |
| WO | 2006/055236 A2 | 5/2006 |
| WO | 2009/073857 A1 | 6/2009 |
| WO | 2009/073864 A1 | 6/2009 |
| WO | 2009/073865 A1 | 6/2009 |

OTHER PUBLICATIONS

International Search Report for PCT Application No. PCT/US08/85749 dated Feb. 2, 2009.

International Search Report for PCT Application No. PCT/US08/85750 dated Feb. 2, 2009.

Yao Fu, "Design of a Hybrid Magnetic and Piezoelectric Polymer Microactuator," PhD Thesis, Swinburne University of Technology, Australia. Published Dec. 2005.

Office Action in U.S. Appl. No. 12/329,462, mailed Jan. 30, 2012.

(56) References Cited

OTHER PUBLICATIONS

Office Action in U.S. Appl. No. 12/329,462, mailed Aug. 21, 2012.
Office Action in U.S. Appl. No. 13/338,182, mailed May 24, 2012.
Office Action in U.S. Appl. No. 12/329,447, mailed Aug. 24, 2011.
Office Action in U.S. Appl. No. 12/329,447, mailed Jan. 13, 2012.
Office Action in U.S. Appl. No. 12/329,447, mailed Aug. 15, 2012.
Examination Report in Singapore Patent Application No. 201003293-6, dated Jan. 16, 2012.
Examination Report in Singapore Patent Application No. 201003413-0, dated Nov. 23, 2011.
Written Opinion in Singapore Patent Application No. 201003293-6, mailed May 31, 2011.
Written Opinion in Singapore Patent Application No. 201003805-7, mailed Jun. 15, 2011.
Office Action in Chinese Application No. 200880118973.8, dated Nov. 9, 2011.
Office Action in Chinese Application No. 200880119457.7, dated Dec. 7, 2011.
Office Action in Chinese Application No. 200880119425.7, dated Oct. 17, 2011.
Office Action in Chinese Application No. 200880119425.7, dated Jul. 4, 2012.
Zhu, J.G., "New Heights for Hard Disk Drives," Materials Today, Elsevier, Jul./Aug. 2003, pp. 22-31.
"Preparation of Hard Disk Drive Magnetic Recording Media for XTEM Analysis," Application Laboratory Report 11, South Bay Technology Inc., May 2007, 3 pages.
"Perpendicular Magnetic Recording Technology," White Paper, Hitachi Global Storage Technologies, Nov. 2007, 4 pages.
Bandic, Z. et al., "Patterned Magnetic Media: Impact of Nanoscale Patterning on Hard Disk Drives," Solid State Technology; accessed from http://www.solid-state.com on Jul. 28, 2008, 4 pages.
Kanellos, M. "A Divide Over the Future of Hard Drives," Cnet News, published Aug. 23, 2006, accessed from http://news.cnet.com on Jun. 12, 2008, 3 pages.
Lammers, D. "MII Tackles Patterned Media Opportunity," Semiconductor International, accessed from http://www.semiconductor.net on Jun. 12, 2008, 5 pages.
Sbiaa, R. et al., "Patterned Media Towards Nano-bit Magnetic Recording. Fabrication and Challenges," Recent Patents on Nanotechnology, vol. 1, 2007, pp. 29-40.
Examination Report in Singapore Patent Application No. 201003805-7, dated Nov. 9, 2012.
Office Action in Chinese Application No. 200880119457.7, dated Sep. 19, 2012.
Office Action in Chinese Application No. 200880119457.7, dated Jun. 9, 2013.
Office Action in Chinese Application No. 200880119457.7, dated Oct. 10, 2013.
Office Action in Chinese Application No. 200880119425.7, dated Jan. 5, 2013.
Office Action in Chinese Application No. 200880119425.7, dated Jun. 4, 2013.
Office Action in Chinese Application No. 200880119425.7, dated Dec. 2, 2013.
Office Action in Japanese Application No. 2010-537124, dated Feb. 5, 2013.
Office Action in Japanese Application No. 2010-537124, dated Nov. 5, 2013.
Office Action in Japanese Application No. 2010-537124, dated Jun. 11, 2013.
Office Action in Japanese Application No. 2010-537132, dated Jan. 31, 2013.
Decision of Grant in Japanese Patent Application No. 2010-537132, dated Dec. 24, 2013.
Office Action in Japanese Application No. 2010-537133, dated Feb. 13, 2013.
Office Action in Japanese Application No. 2010-537133, dated Jul. 2, 2013.
Decision of Grant in Japanese Patent Application No. 2010-537133, dated Nov. 5, 2013.
Examination Report in Taiwanese Application No. 097147265, dated Oct. 22, 2012.
Examination Report in Taiwanese Application No. 097147267, dated Oct. 24, 2012.
Examination Report in Taiwanese Application No. 097147268, dated Jan. 30, 2013.
Office Action for U.S. Appl. No. 12/329,462 dated Oct. 11, 2011.
Notice of Allowance for U.S. Appl. No. 12/329,462 dated Sep. 6, 2012.
Office Action in U.S. Appl. No. 13/338,182, mailed Dec. 4, 2012.
Advisory Action in U.S. Appl. No. 13/338,182, mailed Feb. 19, 2013.
Office Action in U.S. Appl. No. 12/329,457, mailed Aug. 29, 2012.
Office Action in U.S. Appl. No. 12/329,457, mailed Mar. 1, 2013.
Office Action in U.S. Appl. No. 12/329,447 dated Feb. 14, 2013.
Office Action in U.S. Appl. No. 12/329,447 dated Sep. 10, 2013.
Notice of Allowance in U.S. Appl. No. 12/329,447 dated Mar. 14, 2014.
"Conventional Media vs. Patterned Media," Hitachi Global Storage Technologies, accessed from http://www.hitachigst.com on Jun. 12, 2008, 1 page.
Office Action for Japanese Patent Application No. 2013-118321 dated Jul. 15, 2014. (Matter 035241).
Notice of Grounds for Rejection for Japanese Patent Application No. 2010-7012233 dated Sep. 1, 2014. (Matter 035144).
Notice of Grounds for Rejection for Japanese Patent Application No. 2010-7012232 dated Oct. 8, 2014. (Matter 035044).
Office Action for Korean Patent Application No. 10-2010-7012233 dated Mar. 17, 2015.

\* cited by examiner

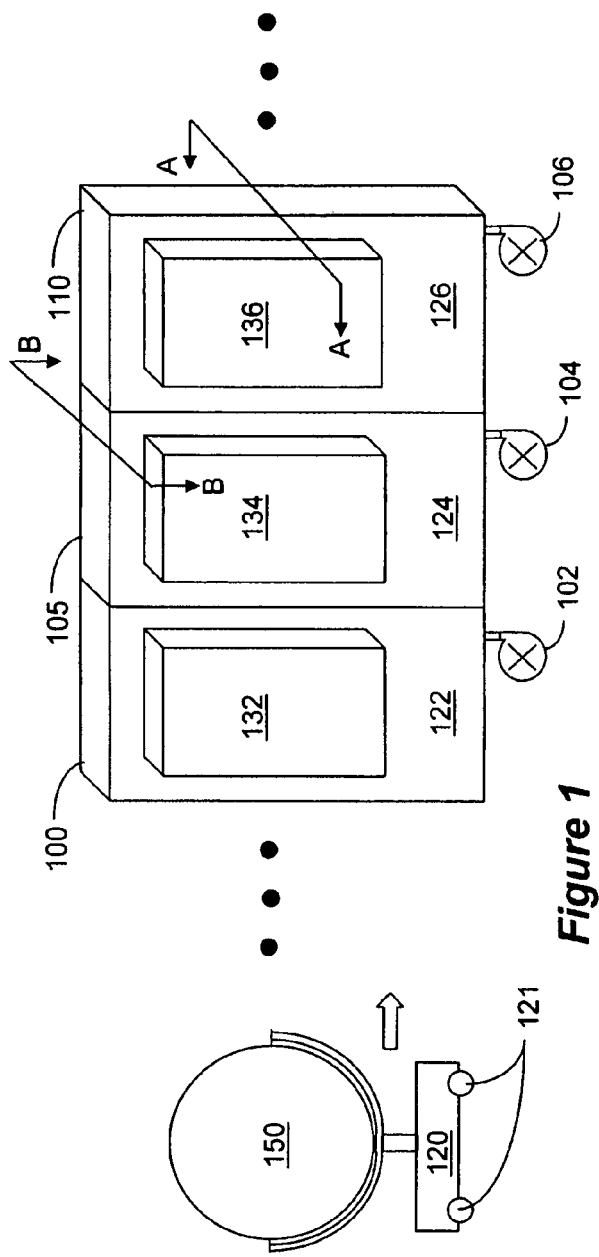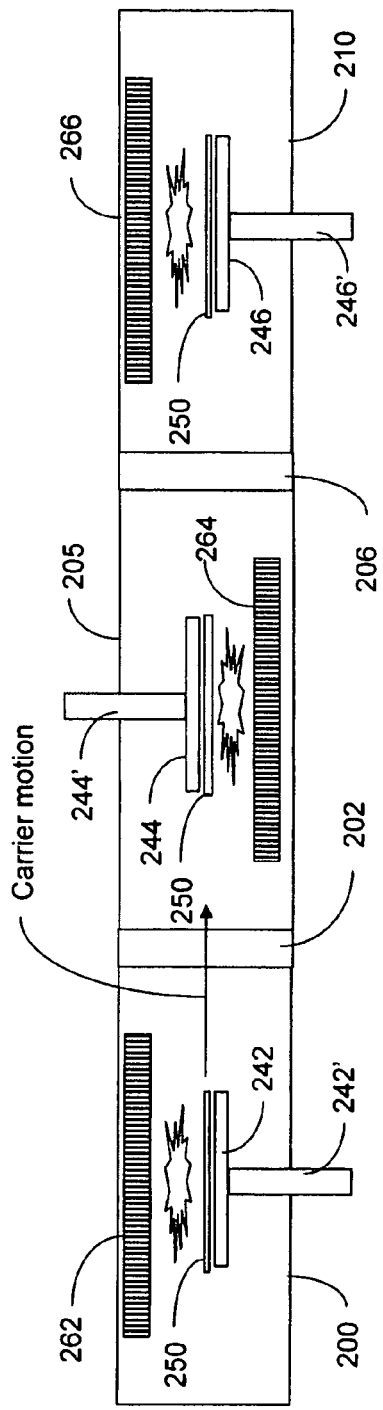
Figure 1
Figure 2

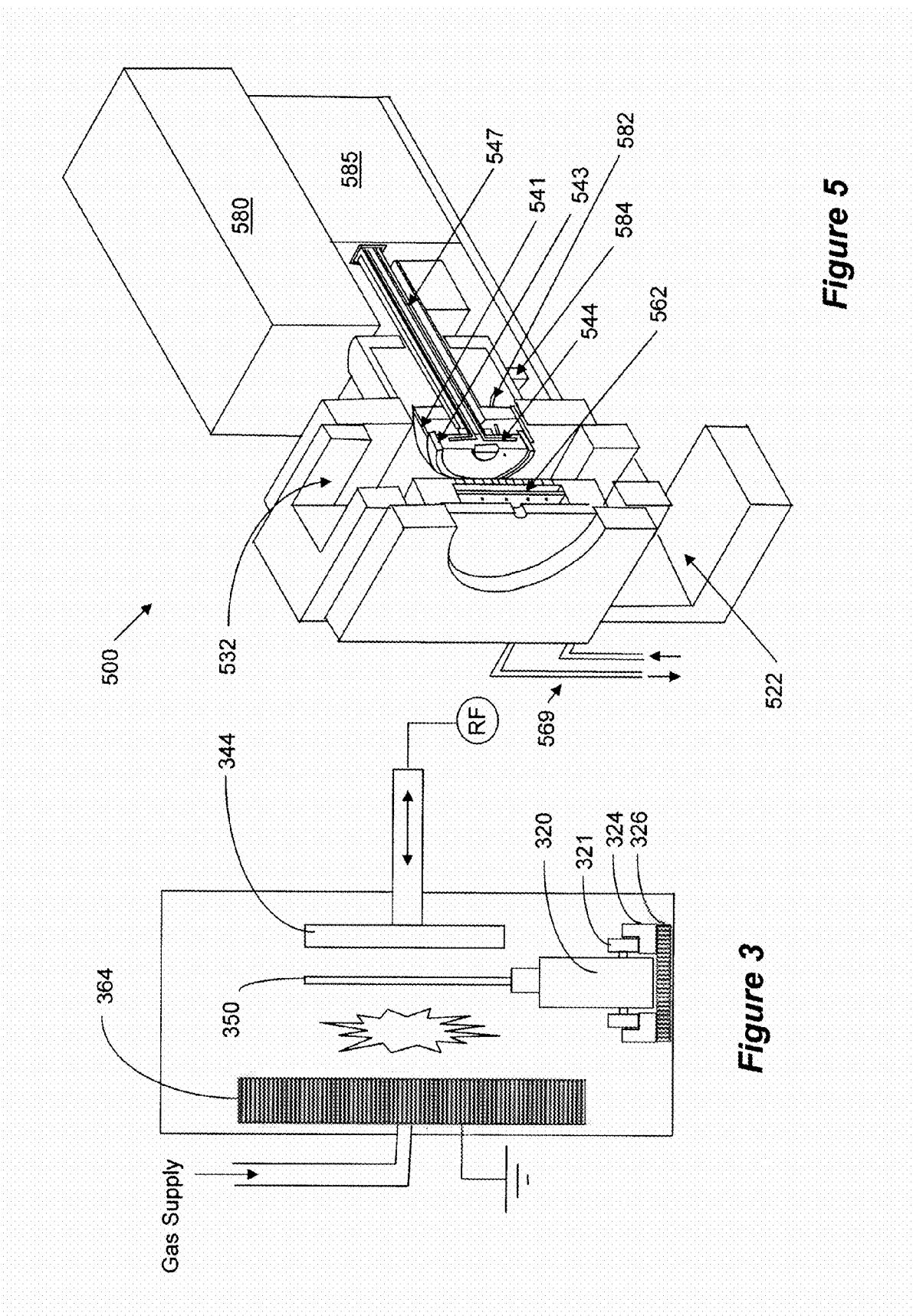

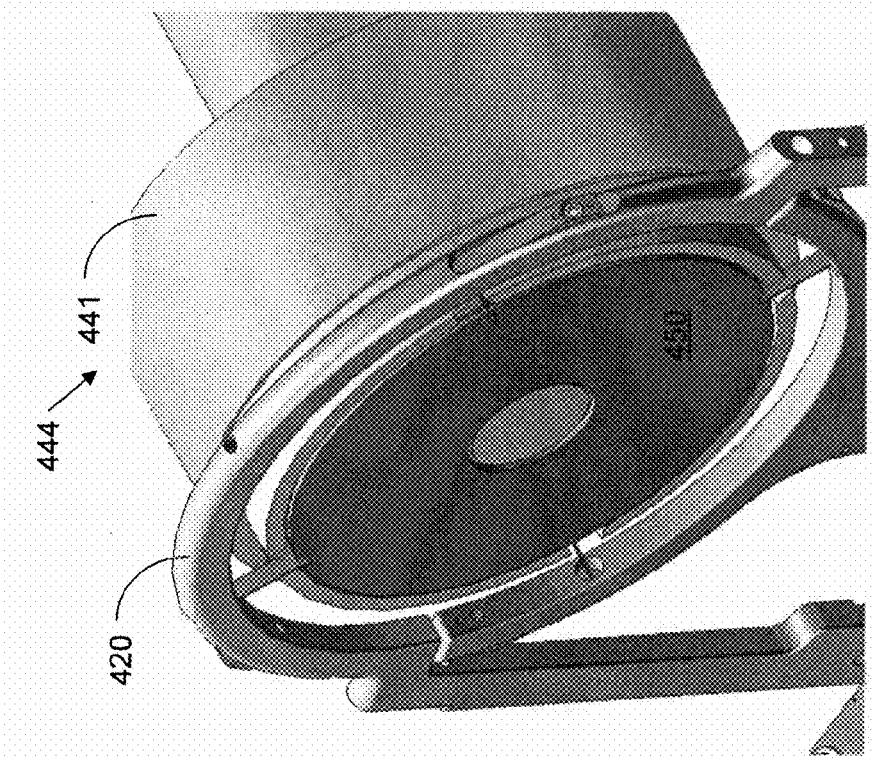
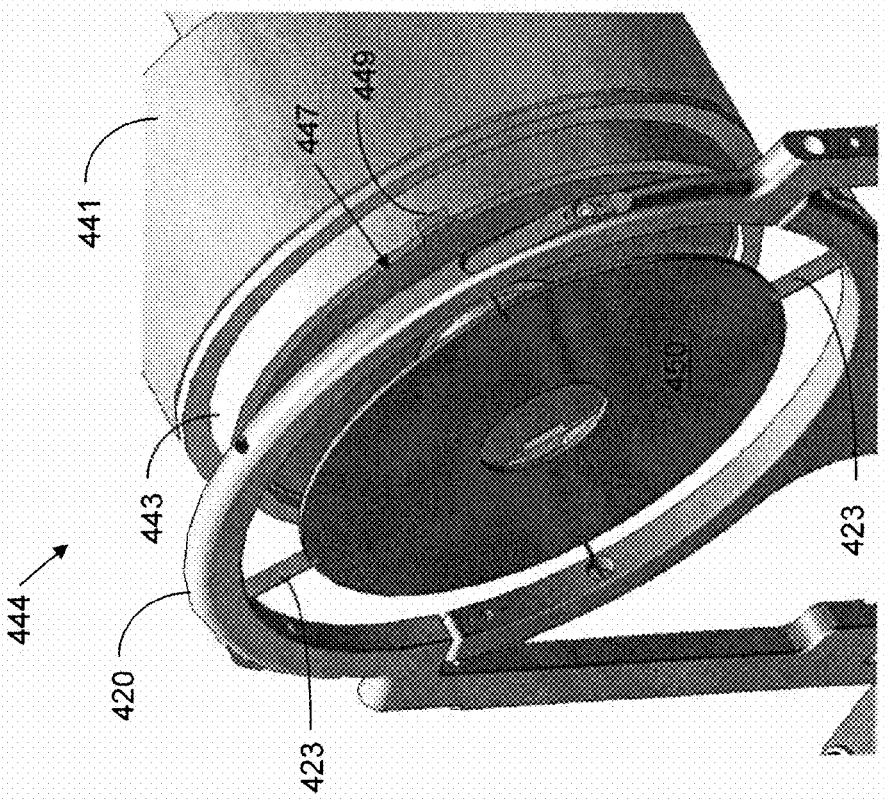
*Figure 4A*  *Figure 4B*

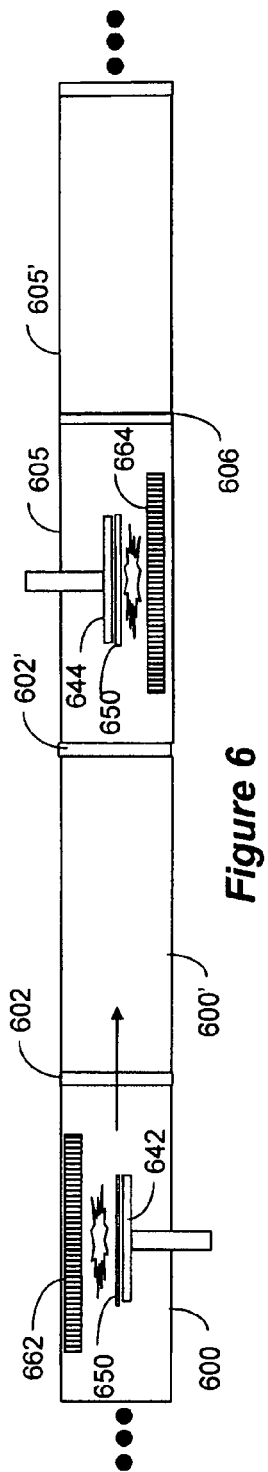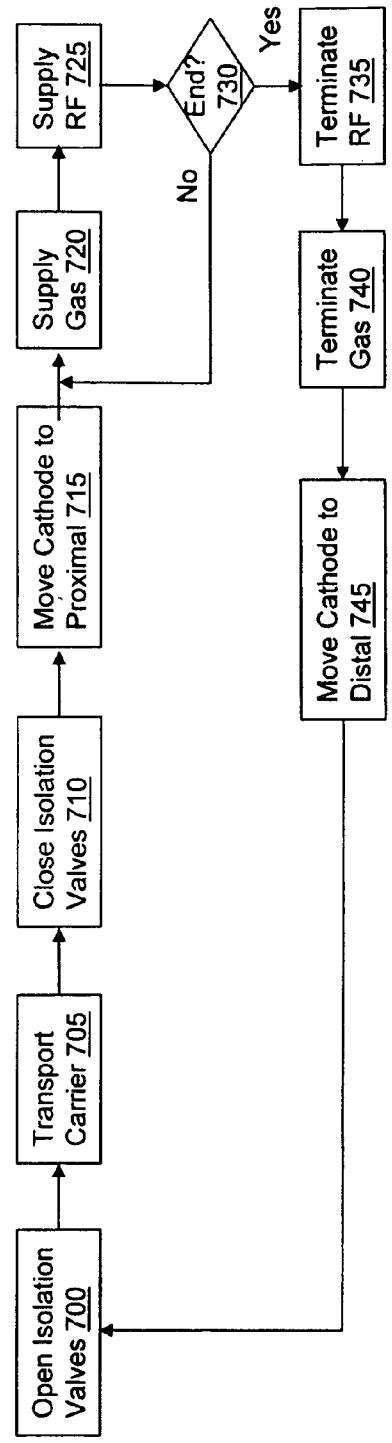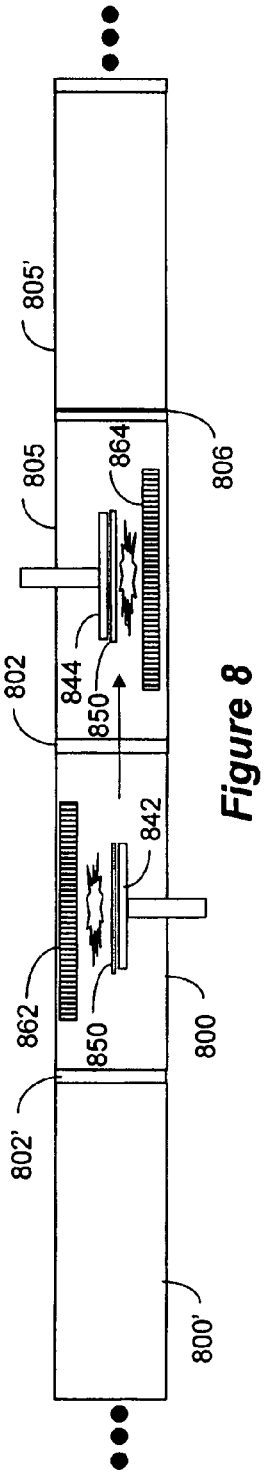
Figure 6
Figure 7
Figure 8

SYSTEM AND METHOD FOR DUAL-SIDED SPUTTER ETCH OF SUBSTRATES

RELATED APPLICATIONS

This Application claims priority from U.S. Provisional Application Ser. No. 61/052,131, filed May 9, 2008, and from U.S. Provisional Application Ser. No. 60/992,972, filed Dec. 6, 2007, the disclosure of which is incorporated herein in its entirety.

This application also relates to U.S. Application, Publication No. 2009/0145881, and U.S. Application Publication No. 2009/0145879.

BACKGROUND

1. Field of the Invention

This invention relates to the art of substrate micro-fabrication and, more particularly, to patterning of substrates such as hard disk for hard disk drives.

2. Related Arts

Micro-fabrication of substrates is a well know art employed in, for example, fabrication of semiconductors, flat panel displays, light emitting diodes (LED's), hard disks for hard disk drives (HDD), etc. As is well known, fabrication of semiconductors, flat panel displays and LED's involves various steps for patterning the substrate. On the other hand, traditional fabrication of hard disks, generally referred to as longitudinal recording technology, does not involve patterning. Similarly, fabrication of disks for perpendicular recording technology does not involve patterning. Rather uniform layers are deposited and memory cells are generally defined by the natural occurrence of grains within the unpatterned magnetic layers.

It has been demonstrated that non-patterned disks would fail to satisfy the needs of the market, in terms of area bit density and costs, in order to remain competitive with other forms of storage. Consequently, it has been proposed that next generation disks should be patterned. It is envisioned that the patterning process may utilize photolithography, although currently there is no certainty which lithography technology may be commercialized, and no commercial system is yet available for commercial manufacturing of patterned media. Among contenders for photolithography are interference photolithography, near field lithography and nano-imprint lithography (NIL). Regardless of the lithography technology utilized, once the photoresist is exposed and developed, the disk needs to be etched. However, to date no technology has been proposed for etching a disk in a commercially viable environment.

To be sure, etch technology is well known and well developed for semiconductor, flat panel display, LED's, etc. However, in all of these applications, only one side of the substrate needs to be etched—allowing a chuck to apply force to and hold the substrate from the backside. A plasma is ignited to etch the front side. Additionally, an electrode is generally embedded in the chuck so as to apply an electrical potential to attract the plasma species to impinge on the front surface of the substrate.

In view of the above, a method and system are required to adopt plasma etching technology for etching hard disks to provide patterned media.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In considering the application of plasma etching technology to hard disks, the subject inventors have recognized that standard plasma etching technology is problematic for etching patterned hard disks. Unlike semiconductors and other applications, the disks need to be etched on both sides. Therefore, conventional systems having plasma etch on only one side are not workable for hard disks. Also, since both sides of the disks are fabricated, no element of the fabrication machine can be allowed to apply clamping force to the disk's surface in order to chuck the disk onto a support. Therefore, prior art systems utilizing conventional chucks cannot be used for processing hard disks, as they apply chucking force to support the disk from its backside. This raises another problem in that, if no chuck can be used to hold the disk, how can a bias potential be applied to cause species of the plasma to impinge on the surface of the disk?

The subject inventors have provided solutions to the above problems and developed etching systems and methods that enable etching of disks in a commercially viable environment. Embodiments of the invention enable plasma etching of both sides of the disks, without applying chucking force to any surface of the disk. Embodiments of the invention also enable applying bias potential to cause the plasma species to impinge the surface of the disk without having the disk attached to a chuck. Plasma is sustained using, e.g., capacitively our inductively coupled RF power, and may be enhanced and/or shaped using magnetic fields.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates part of a system for fabricating a patterned hard disk according to an embodiment of the invention.

FIG. 2 illustrates a cross section along lines A-A in FIG. 1.

FIG. 3 illustrates a cross section along lines B-B in FIG. 1.

FIG. 4A is a partial isometric view shown the movable electrode in a distal position, i.e., away from the disk, while FIG. 4B is a partial isometric view showing the movable electrode in a proximal position, i.e., close to or slightly touching the disk.

FIG. 5 illustrates a disk etch chamber according to an embodiment of the invention.

FIG. 6 illustrates an embodiment of a system having alternating etch chambers and cooling stations.

FIG. 7 illustrate a flow of a process according to an embodiment of the invention.

FIG. 8 illustrates an alternative embodiment of the system according to the invention.

DETAILED DESCRIPTION

Figure 10:
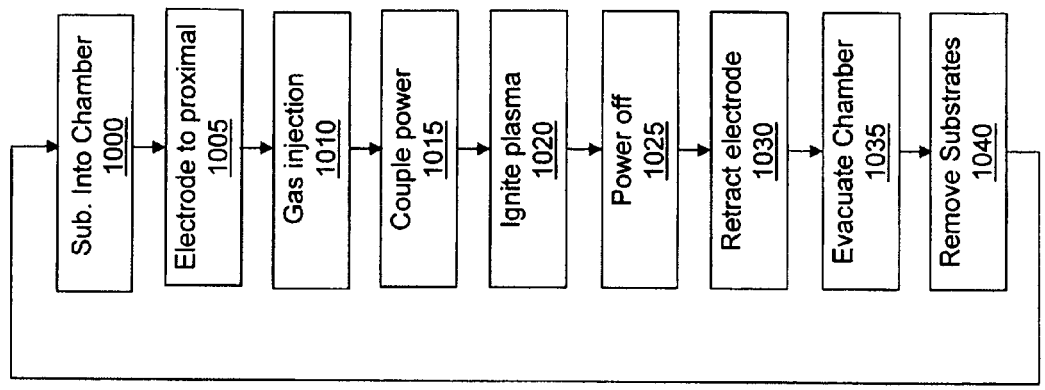
FIG. 10 is a flow chart illustrating a process according to an embodiment of the invention.

According to embodiments of the invention, a system is provided for etching patterned media disks. A movable electrode is utilized to perform sputter etch which is particularly beneficial for sputtering of hard disks used in hard disk drives (HDD). The invention is particularly beneficial for metal etch on a disk of the type commonly referred to as patterned media. The electrode moves to near contact or in slight contact with the substrate so as to couple RF energy to the disk, but no chucking force is applied to the disk. In implementations where the electrode is held at near contact to the disk, the gap between the electrode and the disk should be maintained smaller than the plasma dark space, so as to avoid sustaining plasma between the disk and the electrode. The material to be etched may be metal, e.g., Co/Pt/Cr or similar metals. The substrate is held vertically in a carrier and both sides must be etched. In one embodiment, one side is etched in one chamber and then the second side is etched in the next chamber. An isolation valve is disposed between the two chambers and the disk carrier moves the disks between the chambers. The carrier may be a linear drive carrier, using, e.g., magnetized wheels and linear motors.

In one embodiment the chamber has a showerhead on one side and a movable electrode on the other side. The showerhead may be grounded or biased, and has provisions for delivering gas into the chamber, e.g., argon, reactive gases, such as $CxFy$, $Cl_2$, $Br_2$, etc. The chamber also has guides or rails for the linear drive disk carrier. When the disk carrier assumes processing position, the electrode is moved close to the disk, and may slightly touching it, but does not apply any chucking forces on the disk, i.e., the disk is maintained in place by the carrier. An RF power, e.g., 13.56 MHz is coupled to the electrode, which is capacitively coupled to the disk. A plasma is then ignited in the void between the disk and the showerhead, to thereby sputter material from the face of the disk. The plasma may be ignited and sustained either by the capacitively coupled RF power, or by a separate inductively coupled RF source. Additionally, the plasma may be enhanced and/or shaped using magnetic fields. In the next chamber, the exact arrangement is provided, except in the opposite facing order, so that the opposing face of the disk is etched. A cooling chamber may be interposed between the two chambers, or after the two chambers.

An embodiment of the invention will now be described with reference to the drawings. FIG. 1 illustrates part of a system for fabricating a patterned hard disk according to an embodiment of the invention. In FIG. 1, three processing chambers, 100, 105 and 110, are shown, but the three dots on each side indicates that any number of chambers may be used. Also, While here three specific chambers are shown, it is not necessary that the chamber arrangement shown here would be employed. Rather, other chamber arrangements may be used and other type of chambers may be interposed between the chambers as shown.

For illustration purposes, in the example of FIG. 1 the three chambers 100, 105 and 110 are etch chambers, each evacuated by its own vacuum pump 102, 104, 106. Each of the processing chambers has a transfer section, 122, 124 and 126, and a processing section 132, 134 and 136. Disk 150 is mounted onto a disk carrier 120. In this embodiment the disk is held by its periphery, i.e., without touching any of its surfaces, as both surfaces are fabricated so as to pattern both sides. The disk carrier 120 has a set of wheels 121 that ride on tracks (not shown in FIG. 1). In one embodiment, the wheels are magnetized so as to provide better traction and stability. The disk carrier 120 rides on rails provided in the transfer sections so as to position the disk in the processing section. In one embodiment, motive force is provided externally to the disk carrier 120 using linear motor arrangement (not shown in FIG. 1).

FIG. 2 illustrates a cross section along lines A-A in FIG. 1. For simplicity, in FIG. 2 disk 250 is illustrated without its carrier, but it should be appreciated that the disk remains on the disk carrier throughout the processing performed in the system of FIG. 1, and is transported from chamber to chamber by the disk carrier, as illustrated by the arrow in FIG. 2. In this illustrative embodiment, in each chamber, 200, 205 and 210, the disk is fabricated on one side. As shown in FIG. 2, as the disk moves from chamber to chamber the disk is fabricated on alternating sides, however it should be appreciated that the order of surface fabrication may be changed. Also shown in FIG. 2 are isolation valves 202, 206 that isolate each chamber during fabrication. Each chamber includes a movable electrode (in this example a cathode) 242, 244, 246, mounted onto a movable support 242', 244', 246', and a processing gas delivery apparatus 262, 264, 266, such as a shower head.

FIG. 3 illustrates a cross section along lines B-B in FIG. 1. Disk 350 is shown mounted onto carrier 320. Carrier 320 has wheels 321, which ride on tracks 324. The wheels 321 may be magnetic, in which case the tracks 324 may be made of paramagnetic material. In this embodiment the carrier is moved by linear motor 326, although other motive forces and/or arrangements may be used. Once the chamber is evacuated, process gas is supplied into the chamber via, e.g., shower head 364. In this particular example the shower head is grounded. Plasma is ignited and maintained by applying RF bias energy to the movable cathode 344. While other means for igniting and maintaining the plasma may be utilized, movable cathode provides the bias energy necessary to attract the plasma species and accelerate them towards the disk so as to sputter material from the disk. That is, when the movable cathode 344 is moved to its proximal position, it capacitively couples the RF bias energy to the disk, so that plasma species are accelerated towards the disk so as to etch the opposite surface. Notably, throughout this description, the term proximal position is defined as a position of the electrode where it is very close to, or slightly touching, one surface of the disk, but does not apply any chucking force to the disk. It should be appreciated that while FIG. 3 is explained with respect to a movable cathode 344, the same effect can be achieved by using a moving anode, as will be explained with respect to FIG. 9.

FIG. 4A is a partial isometric view shown the movable electrode in a distal position, i.e., away from the disk, while FIG. 4B is a partial isometric view showing the movable electrode in a proximal position, i.e., close to or slightly touching the disk. FIG. 4A illustrates the situation when the disk is just inserted into the chamber or is about to leave the chamber, and no processing is performed. FIG. 4B illustrates the situation of the chamber during processing, i.e., during etching of the disk. Disk 450 is held by its periphery by clips 423 of carrier 420 (four clips are utilized in this example). The movable electrode assembly 444 includes the electrode housing 441, electrode cover 443, and electrode 447. In this example, electrode cover 443 has notches 449 that match the clips 423, so that in its proximal position, shown in FIG. 4B, the cover does not touch the clips. Also, while a bit obscured, the electrode itself is in a washer shape, matching the shape of the disk, i.e., having a center hole matching the center hole of the disk.

FIG. 5 illustrates an etch chamber according to an embodiment of the invention. In FIG. 5 some elements were cut and some removed in order to expose elements that are relevant to understanding the embodiment. The entire assembly is mounted on a main chamber body 500, having lower part 522 serving as transport chamber for carrier transport and upper part 532 dedicated for disk fabrication, i.e., etch. In this figure, the tracks and linear motor that normally reside in transport chamber 522 have been removed to provide a clearer view. Process gas delivery is done from one side of the main chamber body 500, while RF energy coupling is provided from the other side. In this embodiment process gas is delivered into the chamber using a showerhead assembly 562. RF energy coupling is accomplished using a movable electrode assembly that comes very close to, or slightly touches, the disk. The electrode assembly is moved using motion assembly 585 so as to be in a retracted mode during disk motion and in a proximal mode during etching (see FIGS. 4A and 4B).

In this specific example RF energy coupling is done capacitively from a conductive electrode to the disk and thence to the plasma. The electrode assembly comprises a electrode 544 made of conductive material and shaped to complement the surface of the disk. An electrode cover 543 is provided about the electrode, and extends beyond the electrode 544 so that when the electrode is in its proximal, energized position, the electrode cover 543 covers the edges of the disk. In this position the electrode cover 543 prevents plasma species from attacking the sides of the disk and prevents plasma from reaching the backside surface of the disk, i.e., prevents plasma from accessing the space between the surface facing the electrode and the electrode. Also, the gap between the electrode and the disk should be maintained smaller than the plasma dark space, so as to avoid sustaining plasma between the disk and the electrode.

For non-reactive etch, the process gas may be, for example, argon. Since the magnetic metals generally utilized for magnetic disks may be physically etched, i.e., by sputtering, argon is a suitable process gas. During processing the chamber may be maintained at reduced pressure, e.g., 10-80 millitorr (mT), although certain processes may be performed at pressures of 1 mT to 10 Torr. The RF energy may be set to, e.g., 100-3000 watts, at frequency of, e.g., 13.56 MHz. In the example of FIG. 5 the construction is made compact by coupling the RF match 580 to the etch chamber. RF power from the match 580 is coupled to the conductive electrode 544. In one embodiment, fluid pipes 547 provide fluid as a heat exchange medium to cool or heat the electrode 544. Similarly, fluid pipes 569 may provide heat exchange fluid to the showerhead.

In order to effectively couple the RF energy to the disk, the electrode 544 must be place very close to, or slightly touch the disk. In the embodiments illustrated, the distance between the disk and the electrode may be set to between 0.02" to 0.75". In these examples the placement may be done to an accuracy of ±0.005". In one example, the placement accuracy is enabled by using a proximity sensor, such as, e.g., one or more optical sensors. As shown in FIG. 5, fiber optic 582 provides optical path from the electrode 544 to an optical sensor 584. A plurality of fiber optics and corresponding sensors may be used and various optical techniques may be utilized to enhance placement accuracy and prevent collision with the disk.

In one example, both the electrode and the showerhead are made of hard anodized aluminum. Notably, unlike conventional etch chambers, here the conductive surface of the electrode is exposed and is not covered with an insulator. In other examples, the showerhead is grounded and is fixed, i.e., not movable. Insulating parts may be made of alumina (where exposure to plasma may occur) or Ultem. With the embodiments as described, etch rates higher than 10 nm per second may be achieved.

FIG. 6 illustrates an embodiment of a system having alternating etch chambers and cooling stations. As indicated by the three dotes on each side, the arrangement may repeat itself or be coupled to other chambers performing other processes or to cooling or transfer chambers. Notably, chamber 600 is positioned to etch one surface of the disk 650. The isolation valve 602 is then opened and the disk is moved to cooling chamber 600'. At the next round valve 602' is opened and the disk is moved into etch chamber 605. Etch chamber 605 is positioned to etch the opposite side of the disk. Thereafter the disk is moved to another cooling station 605'.

FIG. 7 illustrate a flow of a process according to an embodiment of the invention. At step 700 the isolation valves are open and at step 705 the carrier is transported so as to place the substrate in the proper position for processing. At step 710 the isolation vales are closed and at step 715 the electrode moves to its proximal position, i.e., near or slight touching, but exerting no force on the substrate. At step 720 gas is supplied to the chamber and at step 725 RF is provided to the electrode to ignite and maintain the plasma. Note that if another arrangement is used to ignite the plasma, e.g., inductive coils, remote microwave, etc., the RF to the electrode is still needed in order to provide the bias potential to accelerate plasma species towards the substrate. The gas and RF are supplied as long as processing proceeds and, when process it terminated at step 730, RF is terminated at 735, gas delivery is terminated at 740, and then the electrode is moved to its distal position, i.e., away from the substrate. The process may then be repeated to process the next disk and move the current disk to another chamber.

FIG. 8 illustrates an alternative embodiment of the system according to the invention. In FIG. 8, the two etching chambers 800 and 805 are coupled without any cooling chamber in between them. Rather, one cooling chamber (either 800' or 805') is provided between each doublets of etch chambers, so that the substrate undergoes etching on both sides before it enters a cooling chamber.

Figure 9:
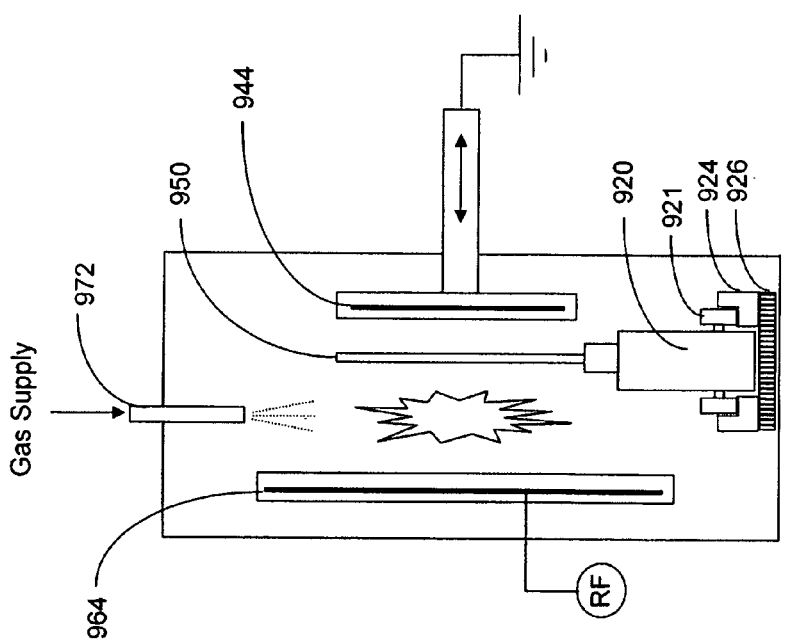
FIG. 9 illustrates certain alternative features according to embodiments of the invention.

FIG. 9 illustrates certain alternative features according to embodiments of the invention. One or more of the features of FIG. 9 may be implemented. For illustration purposes, the chamber of FIG. 9 is similar to that of FIG. 3, highlighting the following differences. For example, in the chamber of FIG. 9, one or more gas injectors 972 are provided, rather than using a showerhead. Conversely, the chamber may employ both a showerhead and gas injectors. For example, the showerhead may provide one type of gas, e.g., inactive gas, while the injector provide another type of gas, e.g., reactive gas. Another feature of the chamber of FIG. 9 is the use of a movable anode. That is, in the chamber of FIG. 9, the RF power is coupled to a stationary electrode 964, which may or may not be embedded in a showerhead. A movable anode 944 is coupled to ground.

FIG. 10 is a flow chart illustrating a process according to an embodiment of the invention. The process of FIG. 10 may be utilized with any of the chambers structured according to the subject invention. In step 1000, a substrate is moved into the chamber. In step 1005 the movable electrode is moved to a proximal position to the substrate. In step 1010 gas is introduced into the chamber and in step 1015 power is coupled to either the movable or stationary electrodes, so that in step 1020 plasma is ignited. In this condition the substrate is processed by, e.g., physical and/or reactive ion etching. When processing step is completed, either by timing or by detecting an end-point, the RF power is turned off in step 1025, the electrode is retracted to its distal position in step 1030, and the chamber is evacuated in step 1035. In step 1040 the substrate is removed and the process repeats itself for another substrate. It should be noted that while removing one substrate and introducing another substrate is shown as two separate steps, these can be done concurrently, i.e., as one substrate moves out the second one may be moved in.

Figure 11:
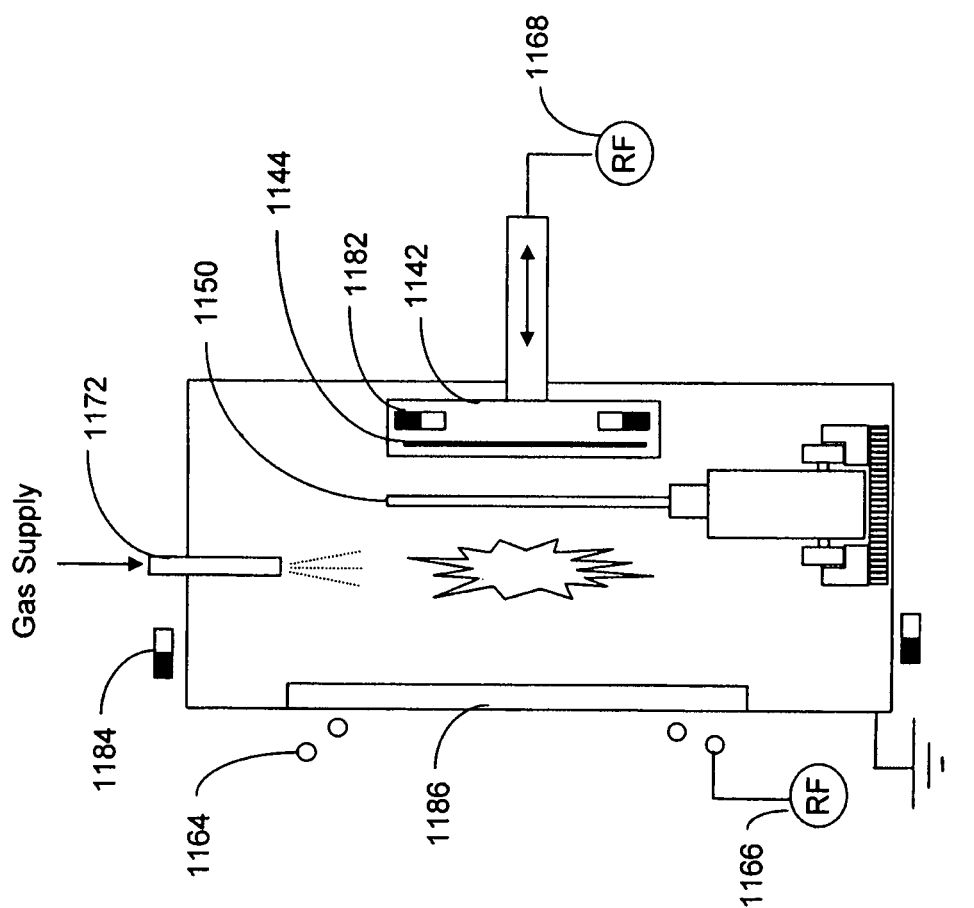
FIG. 11 illustrates certain alternative features according to embodiments of the invention.

FIG. 11 illustrates certain alternative features according to embodiments of the invention. One or more of the features of FIG. 11 may be implemented. For illustration purposes, the chamber of FIG. 11 is similar to that of FIG. 9, highlighting the following differences. For example, in the chamber of FIG. 11, the walls of the chamber are grounded, while the ceiling has an RF transparent window 1186. A coil 1164 is provided about the window and RF supplier 1166 is coupled to the coil 1164. When RF supplier 1166 is energized, it inductively coupled RF energy to ignite and sustain the plasma. The power level of RF supplier 1166 may be controlled to control the plasma density. On the other hand, ion bombardment is controlled by the power applied to electrode 1144 from RF supplier 1168. When using such an arrangement, the RF frequency of the inductive coupling may be set to be the same or higher than that of the movable electrode. For example, the RF frequency of the inductive coupling may be set at 13.56 MHz, while that of the movable electrode at a few hundreds of KHz, or a few MHz, e.g., 2.2 MHz, or also 13.56 MHz. The frequency of the inductive plasma may be higher, e.g., 24 MHz, 60 MHz, etc.

As can be understood, while in the embodiment of FIG. 9 plasma is sustained using capacitively coupled RF power, in this embodiment plasma is sustained using inductively coupled RF power. Of course, other methods for sustaining plasma may be used, such as microwave, remote plasma source, etc.

Also shown in FIG. 11 are magnets 1182, which are embedded in cathode assembly 1142. These magnets are used to enhance and/or confine and/or shape the plasma. For example, the magnets 1182 may be used to push the plasma away from the edge of the cathode assembly 1142. Alternatively, or in addition, magnets 1184 may be provided about the exterior of the chamber so as to enhance and/or confine and/or shape the plasma. Either or both of magnets 1182 and/or 1184 may be permanent magnets or electromagnets.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

The invention claimed is:

1. An etch chamber for etching substrates, comprising:
a main chamber body having an entrance isolation valve and an exit isolation valve opposite the entrance isolation valve, the entrance and exit isolation valves configured to enable passage of substrate carrier;
transport tracks provided inside the main chamber body and positioned between the entrance isolation valve and the exit isolation valve;
a process gas delivery assembly coupled to a first side of the chamber body;
a substrate carrier supporting a substrate, the substrate carrier riding on the transport tracks to enter the main chamber through the entrance isolation valve and exit through the exit isolation valve, wherein when the substrate carrier assumes a processing position the substrate is maintained in place on the substrate carrier;
a plasma power applicator configured to sustain plasma in a void between the process gas delivery assembly and the substrate;
a movable electrode assembly coupled on a second side opposite the first side of the chamber body and opposite the side of the void between the process gas delivery assembly and the substrate, the movable electrode operable to move an electrode to assume a distal position during transport of the substrate and assume a proximal position proximal to the substrate without touching any surface of the substrate during etch processing so as to capacitively couple RF energy through a gap maintained between the electrode and one surface of the substrate and cause plasma species in the chamber to accelerate towards the substrate so as to etch the opposite surface of the substrate; wherein the electrode is shaped to complement the one surface of the substrate.

2. The etch chamber of claim 1, wherein the plasma power applicator comprises an RF power supplier coupled to the movable electrode.

3. The etch chamber of claim 1, wherein the plasma power applicator comprises:
an RF transparent window provided on a side of the chamber body;
an antenna provided about the window; and,
an RF power supplier coupled to the antenna, to thereby inductively couple RF energy through the window.

4. The etch chamber of claim 1, wherein the plasma power applicator comprises one of a microwave or a remote plasma source.

5. The etch chamber of claim 1, further comprising magnets situated to enhance or shape the plasma.

6. The etch chamber of claim 5, wherein the magnets are embedded within the electrode assembly.

7. The etch chamber of claim 5, wherein the magnets are provided about the exterior of the chamber body.

8. The etch chamber of claim 1, wherein the plasma power applicator comprises:
an RF transparent window provided on a side of the chamber body;
an antenna provided about the window;
a first RF power supplier coupled to the antenna, to thereby inductively couple RF energy through the window; and,
a second RF power supplier coupled to the electrode.

9. The etch chamber of claim 8, wherein the RF frequency of the second RF power supplier is set equal to or lower than that of the first RF power supplier.

10. The etch chamber of claim 1, further comprising motor arrangement providing motive force external to the carrier.

11. The etch chamber of claim 1, wherein the movable electrode assembly comprises:
a movable support;
a motion assembly coupled to the movable support; and,
wherein the electrode comprises a conductive electrode having an exposed conductive surface facing the one surface of the substrate.

12. The etch chamber of claim 11, wherein the movable electrode assembly further comprises an electrode cover provided about the electrode and exposing the exposed surface of the electrode.

13. The etch chamber of claim 11, wherein the conductive electrode is washer shaped having a center hole.

14. A system for etching substrates, the system comprising:
a plurality of etch chambers;
a series of tracks enabling transport of a substrate carrier among the etch chambers;
wherein each etch chamber comprises:
- a main chamber body having an entrance isolation valve and an exit isolation valve opposite the entrance isolation valve, the entrance and exit isolation valves configured to enable passage of the substrate carrier;
- a process gas delivery assembly coupled to the chamber body;
- a substrate carrier positioning mechanism, the substrate carrier supporting a substrate during etch process inside the chamber;
- an RF power applicator; and
- a movable electrode assembly coupled on a side of the chamber body and operable to move an electrode to assume a distal position during transport of the substrate and assume a proximal position proximal to the substrate without touching any surface of the substrate during etch processing; and,
wherein during etch processing, one surface of the substrate faces the process gas delivery assembly and the opposite surface of the substrate faces the movable electrode assembly; wherein the electrode is shaped to complement the opposite surface of the substrate to thereby capacitively couple the RF power to the substrate through a gap maintained between the electrode and the substrate.

15. The system of claim 14, further comprising a plurality of cooling chambers interposed among the etch chambers, each cooling chamber having an entrance isolation valve and an exit isolation valve opposite the entrance isolation valve, the entrance and exit isolation valves configured to enable passage of the substrate carrier.

16. The system of claim 15, wherein one cooling chamber is interposed between two etch chambers.

17. The system of claim 15, wherein one cooling chamber is positioned abutting two consecutively connected etch chambers.

18. The system of claim 14, wherein the RF power applicator comprises one of: a capacitively coupled RF source, an inductively coupled RF source, and a microwave source.

19. The system of claim 18, wherein the RF power applicator further comprises magnets.

20. The etch chamber of claim 1, wherein the chamber is configured to etch substrates by:
- transporting a substrate into the chamber;
- moving the movable electrode to a position proximal to the substrate such that a gap between the substrate and the movable electrode is less than plasma dark space;
- injecting gas into the chamber;
- coupling RF power to the movable electrode so as to capacitively couple RF energy through one surface of the substrate and cause plasma species in the chamber to accelerate towards the substrate so as to etch the opposite surface of the substrate;
- at the end of the etching process, ceasing the coupling of RF power, retracting the movable electrode to a distal position, and removing the substrate from the chamber.

* * * * *